United States Patent [19]

Lezec et al.

[11] Patent Number: 5,256,579
[45] Date of Patent: Oct. 26, 1993

[54] TUNABLE-FREQUENCY GUNN DIODES FABRICATION WITH FOCUSED ION BEAMS

[75] Inventors: Henri Lezec; Khalid Ismail, both of Cambridge, Mass.

[73] Assignee: Massachusetts Institute of Technology, Cambridge, Mass.

[21] Appl. No.: 332,695

[22] Filed: Apr. 3, 1989

[51] Int. Cl.$^5$ .......................................... H01L 21/265
[52] U.S. Cl. .................... 437/22; 437/176; 437/904
[58] Field of Search ............... 357/3; 437/21, 22, 176, 437/904; 148/DIG. 83, DIG. 84

[56] References Cited

U.S. PATENT DOCUMENTS

| | | | |
|---|---|---|---|
| 3,509,491 | 4/1970 | Rindner et al. | 331/107 |
| 3,575,643 | 4/1971 | Suga et al. | 357/3 |
| 3,740,666 | 6/1973 | Thim | 357/3 |
| 3,897,276 | 7/1975 | Kondo | 437/30 |
| 3,916,427 | 10/1975 | Ying et al. | 357/12 |
| 4,006,490 | 2/1977 | Moutou et al. | 357/2 |
| 4,060,820 | 11/1977 | Pucel et al. | 357/90 |
| 4,064,620 | 12/1977 | Lee et al. | 437/6 |
| 4,075,651 | 2/1978 | James | 357/22 |
| 4,104,085 | 8/1978 | Zandueld | 437/904 |
| 4,481,042 | 11/1984 | Takigawa et al. | 437/41 |
| 4,764,249 | 8/1988 | Gobrecht et al. | 437/157 |
| 4,975,661 | 12/1990 | Gloanec | 331/107 G |

FOREIGN PATENT DOCUMENTS

| | | |
|---|---|---|
| 52-58380 | 5/1977 | Japan . |
| 60731 | 5/1985 | Japan ......................... 148/DIG. 83 |
| 1-19784 | 1/1989 | Japan . |

OTHER PUBLICATIONS

Sardbank, C. P., "Synthesis of Complex Electronic Functions by Solid State Bulk Effects", Solid State Electronics, vol. 10, pp. 369–380, 1967.

Shoji, M., "Functional Bulk Semiconductor Oscillators", IEEE Trans-Electron Devices vol. ED-14, No. 9, pp. 535–546, Sep. 1967.

Mizutari, T., "GaAs Planar Gunn Digital Devices by Sulphur Ionimplantation", Electronic Letters vol. 11, No. 25/26 pp. 638–639, Dec. 1975.

Seliger, R., et al, "Fabrication of Lateral Doping Profiles by a Computer-Controlled Fucused Ion Beam", J. Vac. Sci. Techiol., vol. 12, No. 6 Nov./Dec. 1975.

Copeland, J. A., Hayashi, T.; Uenohana, M. "Logic and Memory Elements Using Two-Valley Semiconductors". IEEE Proceedings, Apr. 1967, p. 584.

Engelbrecht, Rudolf S.; "Solid-State Bulk Phenomena and Their Application to Integrated Electronics". IEEE Journal of Solid State Circuits, vol. SC-3, No. 3, p. 210. Sep. 1968.

Sekido, K; Takeuchi, T; Hasegawa, F; Kikushi, S. "CW Oscillations in GaAs Planar-Type Bulk Diodes," IEEE Proceedings, May 1969, pp. 815–816.

Sekido, K; Takeuchi, M; Takayama, T; Hasegawa, F; Hayakawa, T. "Fabrication of Planar-Type GaAs Bulk Effect Pulse Devices," Proceedings of the First Conference on Solid State Devices, 1969, pp. 19–24.

Takeuchi, M; Higashisaka, A; Sekido, K. "GaAs Planar Gunn Diodes for DC-Biased Operation," IEEE Transactions on Electronic Dev. Jan. 1972, pp. 125–127.

Kurumada, K; Mizutani, T; Fjuimoto, M. "GaAs Planar Gunn Digital Devices with Subsidiary Anode," Electronics Letters, 2 May '74, vol. 10, No. 9, pp. 161–163.

Sugeta, T; Yanai, H; Sekido, K. "Schottky-Gate Bulk Effect Digital Devices," IEEE Proceedings, Nov. 1971, pp. 1629–1630.

Primary Examiner—George Fourson
Attorney, Agent, or Firm—Wolf, Greenfield & Sacks

[57] ABSTRACT

A tunable-frequency Gunn diode which is fabricated using focused ion beam inplantation to vary the doping profile of the diode along the drift path between cathode and anode. A gated device is also described. In this variation, a graded or tapered Gunn diode is combined with one or more Schottky barrier gates. At fixed ohmic contact bias, the frequency of oscillation of the device current can be controlled by varying the gate voltage(s).

39 Claims, 6 Drawing Sheets

Sugeta, T; Yanai, H; Ikoma, T. "Switching Properties of Bulk-Effect Digital Devices," IEEE Transactions on Electronic Dev., Oct. 1970, pp. 940-942.

Shoji, M.; D'Alessio, F. J. "Improvement of Reliability of Gunn Diodes," IEEE Proceedings, Feb. 1969, pp. 250-251.

Mause, K. "Simple Integrated Circuit with Gunn Devices," Electronic Letters, 10 Feb. 1972, vol. 8, No. 3, pp. 62-63.

Charlton, R; Hobson, G. S. "The Effect of Cathode-Notch Doping Profiles on Supercritical Transferred-Electron Amplifiers," IEEE Transactions on Electron Devices, vol. ED-20, No. 9, Sep. 1973, pp. 812-817.

Shoji, M. "A Voltage Tunable Gunn-Effect Oscillator," IEEE Proceedings, Jan. 1967, pp. 130-131.

Shoji, M. "Controlled Bulk Semiconductor Current Pulse Generator," IEEE Proceedings, May 1867, pp. 710-711.

Shoji, M. "Bulk Semiconductor High-Speed Current Waveform Generator." IEEE Proceedings, May 1967, pp. 720-721.

Shoji, M. "Temperature-Gradient Controlled Voltage Tunable Bulk Semiconductor Oscillator," IEEE Proceedings, Sep. 1967, pp. 1646-1647.

Shoji, M. "Two-Dimensional Gunn-domain Dynamics," IEEE Transactions on Electron Devices, vol. ED-16, No. 9, Sep. 1969, pp. 748-758.

Kino, G. S.; Kuri, I. "High-Efficiency Operation of a Gunn Oscillator in the Domain Mode," IEEE Transactions on Electron Devices, vol. ED-16, No. 9, Sep. 1969, pp. 735-748.

Shoji, M. "Dynamics of Gunn Domains in Functional Bulk Oscillators," Proceedings of the 1st Conference on Solid State Devices, Tokyo, 1969, Supplement to the Journal of the Japan Society of Applied Physics, vol. 39, 1970, pp. 12-18.

Thim, H. M. "Computer Study of Bulk GaAs Devices with Random One-Dimensional Doping Fluctuations," Journal of Applied Physics, vol. 39, No. 8, Jul. 1968, pp. 3897-3904.

Sze, S. M., High-Speed Semiconductor Devices. (New York: John Wiley & Sons, 1990), pp. 574-576.

Bosch, B. G.; Engelmann, R. W. H. Gunn-Effect Electronics. (New York; John Wiley & Sons, 1975).

Vasil'ev, N. A.; Lukash, V. S.: Murav'ev, V. V.; Shalatonin; V. I. "The Present State and Main problems in developing Gunn-Diode Millimeter-Band Generators (Survey)," Izvestiya. VUZ.Radioelektronika, vol. 28, No. 10, pp. 42-50 1985.

Chen, J. C.; Pao, C. K.; Wong, D. W. "Millimeter-Wave Monolithic Gunn Oscillators," IEEE 1987 Microwave and Millimeter-Wave Monolithic Circ. Symp. pp. 11-13.

Lan, G. L.; Chen, J. C.; Pao, C. K.; Hermann, M. I. "A W-Band Channelized Monolithic Receiver," IEEE 1989 Microwave and Millimeter-Wave Mono.Circ.Symp. pp. 95-99.

Goldwasser, R.; Donoghue, D.; Dawe, G.; Nash, S.; Fingerman, C.; Crossley, I.; Mason, C.; Rafaelli, L.; and Tayrani, R. "Monolithic Ka-Band VCOs," IEEE 1988 Microwave and Millimeter-Wave Monolithic Circuits Symposium, pp. 55-58.

Chu, A; Chu, L; Sloat, D.; Theobald, M.; Teunas, J.; Litchfield, T.; Moroney, W. "Low Cost Millimeter Wave Monolithic Receivers," IEEE 1987 Microwave and Millimeter-Wave Monolithic Circuits Symposium, pp. 63-67.

Cohen, L. D.; Sard, E. "Millimeter-Wave, Lumped Element, Gunn VCO's with Ultrawide band 20 GHz Tuning," IEEE 1989 MTT-S Digest, pp. 1287-1290.

Herman, M. I.; Lan, G.-L.; Chen, J. C.; Pao, C.-K. "Multifunction W-Band MMIC Receiver Technology," Proceedings of the IEEE, vol. 79, No. 3 Mar. 1991, pp. 342-354.

NEC Corporation, NEC Microwave and RF Semiconductors, (Santa Clara, Calif.: California Eastern Laboratories, 1989), pp. A7-A12.

Shah, P. L. and Rabson, T. A. "Combined Doping and Geometry Effects on Transferred-Electron Bulk Instabilities," *IEEE Transactions on Electron Devices*, vol. ED-18, No. 3, Mar. 1971, pp. 170-174.

Kino, G. S. and P. N. Robson. "The Effect of Small Transverse Dimensions on the Operation of Gunn Devices," *IEEE Proceedings*, Nov. 1968, pp. 2056-2057.

Sze, S. M. High Speed Semiconductor Devices (New York: John Wiley & Sons 1990), pp. 36-46.

Anderson, W. T., Jr.; H. B. Dietrick; E. W. Swiggard; S. H. Lee; M. L. Bark. "Gallium Arsenide Transferred-Electron Devices by Low-Level Ion Implantation", *J. Appl. Phys.*, 51(6), Jun. 1980, pp. 3175-3177.

Mizutani, Takashi; Takashi Honda; Hajime Yamazaki; Masatomo Fugjimoto. "GaAs Planar Gunn Devices with Sulfur-Ion Implanted N Layers," Solid State Electronics, 977, vol. 20, pp. 443-445 (1978).

Mizutani, Takashi; Satoru Ishida; Katsuhiko Kurumada; Masamichi Ohmori. "Selectively Ion Implanted Gunn-F.E.T. Integrated Circuits for Pulse Regenerator," *Electronics Letters*, May 11, 1978, vol. 14, No. 10, pp. 294-295.

Lezec, Henri J.; Christian R. Musil; John Melngailis; Leonard J. Mahoney; John D. Woodhouse. "Dose-Rate Effects in Focused-Ion-Beam Implantation of Si into GaAs," J. Va. Sci. Technol., B9(5), Sep./Oct. 1991, pp. 2709-2713.

Shah, Pradeep L. and T. A. Rabson. "Effect of Various Boundary Conditions on the Instabilities in Transferred Electron Bulk Oscillators," Journal of Applied Physics, vol. 42, No. 2, Feb. 1971, pp. 783-798.

Robrock, R. B., II. "Analysis and Simulation of Domain Propagation in Nonuniformly Doped Bulk GaAs," *IEEE Transactions on Electron Devices*, vol. ED-16, No. 7, Jul. 1969, pp. 647-653.

Anderson, W. T.; H. B. Dietrich; A. Christov; M. L. Bark. "Transferred-Electron Device Development Using Silicon-Ion Implantation in GaAs," *IEEE Transactions on Electron Devices*, vol. ED-26, No. 11, Nov. 1979, pp. 1854-1855.

Tichauer, L. M.; T. G. Mills; D. J. Dodson. "Design of TED's for Frequency Divider Application," *Technical Digest*, 1978. *International Electron Devices Meeting.* (IEEE, N.Y., 1978), pp. 294-297.

B. L. Gelmont and M. S. Shur, "High field Gunn domains in the presence of electron-hole pairs", Phys. Lett., 36A: 305 (1971).

H. L. Hartnagel, "Gunn Domains in bulk GaAs affected by surface conditions", Phys. Stat. Solidi (a), 7:, K99, (1971).

J. B. Gunn, "Instabilities of Current in III-V Semiconductors", IBM J. Res. Dev., 8 141 (1964).

R. H. Walden, A. E. Schmitz, L. E. Larson, A. R. Kramer, and J. Pasiecznik, "A 4-bit, 1GHz Sub-Half Micrometer CMOS/SOS Flash Analog-to-Digital Converter Using Focused Ion Beam Implants", Proceedings of the IEEE 1988 Custom Integrated Circuits Conference, May 1988, Rochester, N.Y., p. 18.7.1.

M. Tamura, S. Shukuri, Y. Wada, Y. Makodoro, and T. Ishitani, "Focused Ion Beam Implantation Into Si", Proceedings of the 12th Int'l Conference on Applications of Ion Beams in Materials Science, Sep., 1987, Tokyo, p. 17.

M. Tamura, S. Shukuri, Y. Wada, T. Ishitani, M. Ichikawa, and T. Doi, "High Dose Rate Effect of Focused-Ion-Beam Boron Implantation into Silicon", Jpn. J. Appl. Phys. 23, L417 (1984).

Y. Bamba, E. Miyauchi, H. Arimoto, K. Kuramoto, A. Takamori, and H. Hashimoto, "Focused Si Ion Implantaion in GaAs", Jpn. J. Appl. Phys., 22, L650 (1983).

Y. Bamba, E. Miyauchi, H. Arimoto, A. Takamori, and H. Hashimoto, "Reduced Damage Generation in GaAs Implanted with Focused Be Ions", Jpn. J. Apply. Phys., 23, L515-L517 (1984).

Y. Bamba, E. Miyauchi, M. Nakajima, H. Arimoto, A. Takamori, and H. Hashimoto, "Si Depth Profiles in Focused-Ion-Beam-Implanted GaAs", Jpn. J. Appl. Phys., 24, L6 (1984).

R. Wilson and D. M. Jamba, "Dependence of implanted Se and S profiles on GaAs implantation temperature and crystallinity", Appl. Phys. Lett. 39(9) Nov. 1, 1981.

M. G. Grimaldi, B. M. Paine, M-A. Nicolet, and D. K. Sadana, J., "Ion implantation and low-temperature epitaxial regrowth of GaAs" Appl. Phys., 52, 4038 (1981).

L. T. Chadderton, "Nucleation of Damage Centres During Ion Implantation of Silicon", Radiation Effects, 1971, vol. 8, pp. 77-86.

O. W. Holland, D. Fathy, J. Narayan, and O. S. Oen., "Dose Rate Dependence of Damage Clustering During Heavy Ion Irradiation in Si", Radiation Effects, 1985, vol. 90, pp. 127-139.

J. S. Harris, "The Effects of Dose Rate and Implantation Temperature on Lattice Damage and Electrical Activity in Ion-Implanted GaAs", Ion Implantation in Semiconductors, edited by I. Ruge and J. Graul (Springer Verlag, Berlin), p. 157 (date unknown).

W. H. Weisenberger, S. T. Picraux, and F. L. Vook, "Low Temperature Channeling measurements of Ion Implantation Lattice Disorder in GaAs", Rad. Effects, vol. 9, pp. 121-125 (1971).

A. W. Tinsley, G. A. Stevens, M. J. Nobes, and W. A. Grant, "Dose Rate Effects in Indium Implanted GaAs", Rad. Effects, vol. 23, pp. 165-169 (1974).

N. A. G. Ahmed, C. E. Christodoulides, G. Carter, M. J. Nobes, and A. I. Titov, "The Application of Low Angle Rutherford Backscattering and Channeling Techniques to Determine Implantation Induced Disorder Profile Distributions in Semiconductors", Nuclear Instr. and Methods, 168, 283 (1980).

F. L. Vook and H. J. Stein, "Relation of Neutron to Ion Damage Annealing in Si and Ge", Rad. Effects, 2: pp. 23–30, (1969), 2: 139 (1969), and Evidence For Vacancy Motion in Low Temperature Ion-Planted Si, Rad. Effects, 6: pp. 11–17, (1970).

F. G. Moore, H. B. Dietrich, E. A. Dobisz, and O. W. Holland, "Silicon implantation into GaAs: Observations of dose rate dependent electrical activation and damage", Appl. Phys. Lettl., 57: 911–913 (1990).

W. Chu, A. Yen, K. Ismail, M. I. Shepard, H. J. Lezec, C. R. Musil, J. Melngailis, Y. C. Ku, J. M. Carter, and H. I. Smith, "Sub-100-nm x-ray mask technology using focused-ion-beam lithography", J. Vac. Sci. Technol., B 7 (6): 1583 (1989).

J. E. Murguia, C. R. Musil, M. I. Shepard, H. J. Lezec, D. A. Antoniadis, and J. Melngailis, "Merging focused ion beam patterning optical lithography in device and circuit fabrication", J. Vac. Sci. Technol., B 8 (6): 1374 (1990).

P. N. Butcher, "Theory of Stable Domain Propagation in the Gunn Effect", Phys. Lett., 19: 546 (1965).

P. N. Butcher, W. Fawcett, and C. Hilsum, "A Simple Analysis of Stable Domain Propagation in the Gunn Effect", Br. J. Appl. Phys., 17: 841 (1966).

P. N. Butcher and W. Fawcett, "Stable Domain Propagation in the Gunn Effect", Br. J. Appl. Phys., 17: 1425 (1966).

P. N. Butcher, W. Fawcett, and N. R. Ogg, "Effect of Field-Dependent Diffusion on Stable Domain Propagation in the Gunn Effect", Br. J. Appl. Phys., 18: 755 (1967).

J. A. Copeland, "Electrostatic Domains in Two-Valley Semiconductors", IEEE Trans. Electron Devices, ED-13, 189 (1966).

J. A. Copeland, "Stable Space-Charge Layers in Two-Valley Semiconductors", J. Appl. Phys., 37: 3602 (1966).

K. Ismail, M.Sc. thesis, Faculty of Engineering, Cairo University, Cairo, Egypt, 1985.

S. M. El-Ghazaly and T. Itoh, "Analysis and Improvement of mm-wave GaAs MESFET's", Technical Report, Army Research Office contract DAAG 29-8-4-K-0076, May 1988.

I. Mouatakif, M. Lefebvre, Y. Crosnier, and G. Salmer, "Fundamental Limitations of Power InP MISFET due to Gunn Oscillations", Proceedings of the Second International Conference on Indium Phosphide and Related Materials, Apr. 1990, Denver, Colo. (IEEE, New York, 1990), p. 84.

C. Hisum, "Simple Empirical Relationship between Mobility and Carrier Concentration", Electron. Lett., 10: 259 (1974).

J. G. Ruch, and W. Fawcett, "Temperature dependence of the transport properties of gallium arsenide determined by a Monte Carlo method", J. Appl. Phys., 41: 3843 (1970).

J. Xu and M. S. Shur, "Temperature dependence of electron mobility and peak velocity in compensated GaAs", Appl. Phys. Lett., 52: 11 (1988).

Thim et al., "Quenched Bulk GaAs Oscillators with Doping Gradients", Journal of Applied Physics, Feb. 1969, pp. 904–906.

Dumke, "Microwave Oscillator", IBM Technical Disclosure Bulletin, vol. 8, No. 11, Apr. 1966, pp. 1646–1647.

Lezec et al, "A Tunable-Frequency Gunn Diode Fabricated by Focused Ion-Beam Implantation", IEEE Electron Device Letters, vol. 9, #9, Sep. 1988, 476–478.

Melngailis, "Critical Review—Focused ion beam technology and applications", J. Vac. Sci. Technol. B5(2), Mar./Apr. '87, 469–495.

Newton, C. O. and Bew, G., "Frequency measurements on Gunn effect devices with concentric electrodes", J.Phys.D:Appl.Phys., '70, vol. 3, 1189–1198.

Ondria, John and Ross, Raymond L., "Improved Performance of Fundamental and Second Harmonic MMW Oscillators Through Active Device Doping Concentration Contouring", 1987 IEEE MTT-S Digest, 977–980.

"Planar Gunn-Effect Oscillators with Concentric Electrodes", Electronics Letters, 2nd Oct. 1969, vol. 5, No. 20, 470–471.

Ross, R. L. et al, "Millimeter-Wave Gunn Oscillators with Temperature-Compensated Impurity Profiles", IEEE Transactions on Electron Devices, vol. ED-33, No. 11, Nov. '86, 1867.

"Voltage Tuning of Concentric Planar Gunn Diodes", Electronics Letters, Nov. '67, vol. 3, No. 11, 498–500.

TUNABLE-FREQUENCY GUNN DIODES FABRICATION WITH FOCUSED ION BEAMS

The Government has rights in this invention pursuant to contract Number MDA-903-85C-0215 awarded by the Department of the Army.

FIELD OF THE INVENTION

This invention relates to Gunn diodes and, more particularly, to Gunn diodes with a variable domain transit-time and, thus, variable-frequency mode of operation. These elements can be used as voltage controlled oscillators in the microwave frequency range.

BACKGROUND OF THE INVENTION

Gunn diodes, particularly those fabricated from GaAs, are among the most important solid state sources of microwave power. Frequency tuning of oscillators using such diodes is usually obtained in resonant circuits where a Gunn diode may operate in different modes of oscillation. Tuning is produced with an external device either mechanically, by varying the dimensions of a resonant cavity, or electronically using varactor diodes or ferri magnetic material, particularly YIG spheres.

In 1967, a Gunn diode was proposed with a transit-time mode frequency that is directly tunable with a bias voltage. C. P. Sandbank, "Synthesis of Complex Electronic Functions by Solid State Bulk Effects", *Solid State Electronics*, Vol. 10, pp. 369-380, 1967; M. Shoji, "Functional Bulk Semiconductor Oscillators", *I.E.E.E. Transactions on Electronic Devices*, Vol. ED-14, No. 9, pp. 535-546, September 1967. The effect, it was explained, could be obtained by varying the cross section of the device from cathode to anode or by varying the doping concentration. A technology allowing precise control of doping profiles was not available at the time (particularly for GaAs), so only Gunn diodes with non-uniform cross-sections were built. Tapered Gunn diodes and Gunn diodes with concentric electrodes have displayed wide-band frequency tunability when connected to non resonant resistive loads. One example, a planar Gunn diode with concentric electrodes, was tunable with bias voltage over a range of 6.6-18 GHz. G. M. Clarke et al., "Planar Gunn Effect Oscillators with Concentric Electrodes," *Electronics Letters*, Vol. 5, No. 20, pp. 471-472, October 1969. For a variety of reasons, these prior devices have proven unsatisfactory for commercial fabrication. Although it had been predicted that oscillation frequency could be tuned or switched by a bias voltage, and this was indeed measured experimentally in the case of oscillators with non uniform cross-sections, the fabrication of non uniform cross sections generally regured manual machining (i.e., abrading) or a comparable operation. Additionally, monolithic fabrication of electrically tunable Gunn diodes into complex circuits is not possible when mechanical machining of the bulk substrate is needed. Such technigues were therefore not widely adopted. The proposal that tunability could also be obtained with non uniform doping profiles has heretofore been only of academic interest inasmuch as there has been no available way to vary in a controlled manner the doping profile between the electrodes.

Accordingly, it is an object of the present invention to provide a Gunn diode which is frequency tunable by application of a bias voltage.

Another object of the invention is to provide a tunable frequency Gunn diode which does not require a varying cross section.

Still another object of the invention is to provide a tunable-frequency Gunn diode which has a doping concentration which varies along the path from cathode to anode.

Yet another object of the invention is to provide a frequency tunable Gunn diode which can be fabricated as a planar device, which can be integrated with other devices on the same substrate.

SUMMARY OF THE INVENTION

The foregoing and other objects and advantages are achieved in a tunable frequency Gunn diode which is fabricated using focused ion beam implantation to vary the doping profile of the diode along the drift path between cathode and anode. The use of focused ion beam technology allows fabrication of a planar structure which can be integrated with other devices directly into monolithic circuits. Further, diodes with different lateral doping profiles and frequency versus bias characteristics can be defined on a single wafer or even in the same circuit.

The device is small and eliminates the need for external resonant cavity tuning or for complex electronic tuning schemes.

A three-terminal gated device is also described. In this variation, a graded doping or tapered Gunn diode is combined with a Schottky barrier gate. At fixed ohmic contact bias, the frequency of oscillation of the device current can be controlled by varying the gate voltage.

The invention will be more fully understood from the detailed description which follows, which should be read in conjunction with the accompanying drawing.

DETAILED DESCRIPTION

Figure 1A:
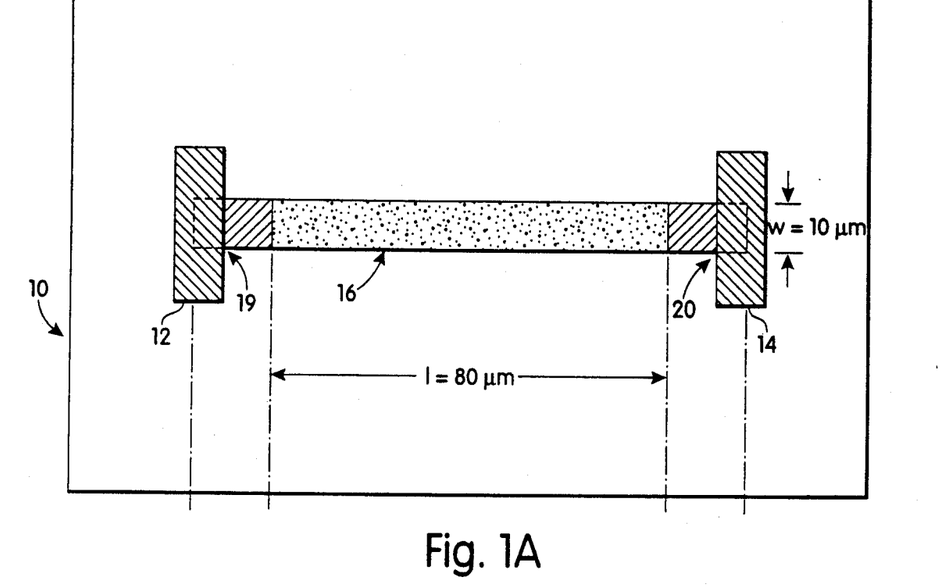
FIG. 1A is a schematic top view of a Gunn diode according to the invention.
Figure 1B:
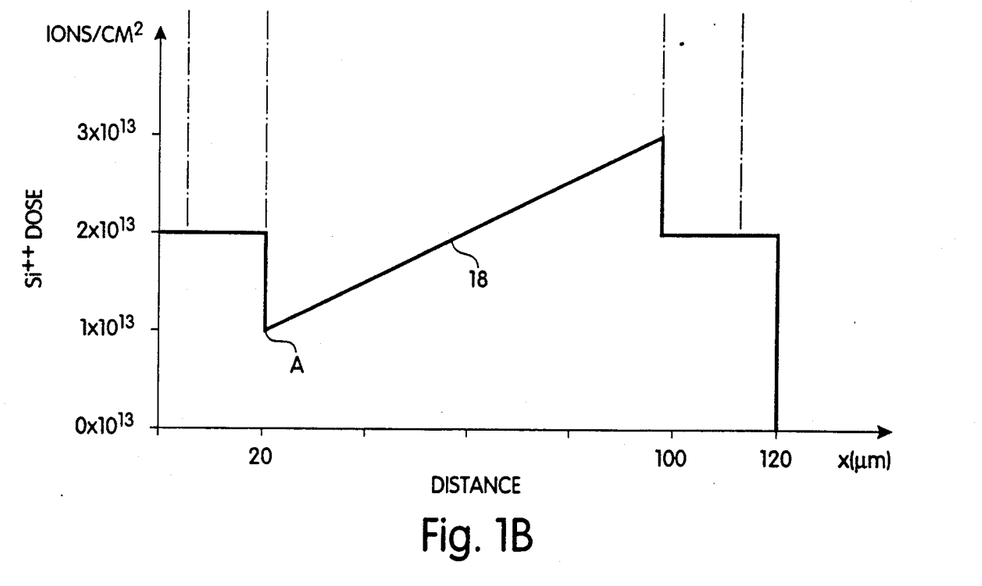
FIG. 1B is a diagram of a typical doping profile for the device of FIG. 1A.

Referring now to FIG. 1A, a top view is shown of a Gunn diode 10 according to the present invention. The diode comprises a pair of ohmic contacts 12 and 14, respectively comprising the cathode and anode contacts, and a graded semiconductor area 16. Typical dimensions for the length, 1, of the active semiconductor is about 80 μm, and typical width, w, is about 10 μm. A typical doping profile 18 is shown in FIG. 1B. There, the dose is varied linearly from $10^{13}$ to $3\times10^{13}$ cm$^{-2}$ over the length of the active region 16.

Figure 2:
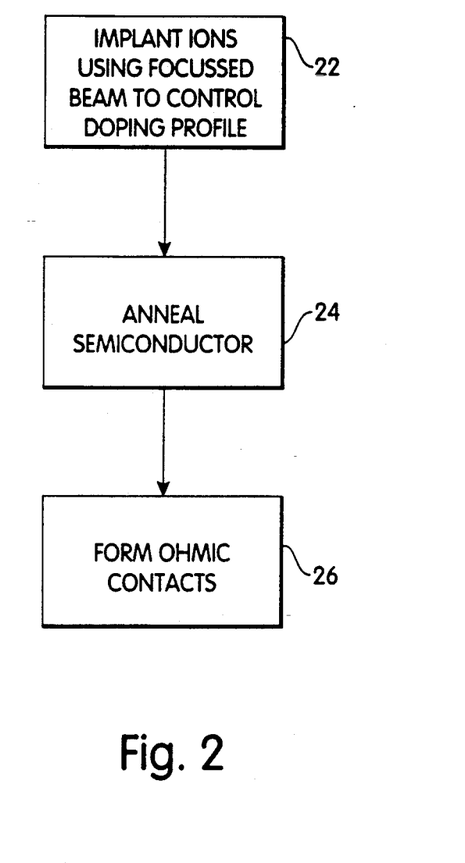
FIG. 2 is a flow chart of the basic Gunn diode fabrication technique of the present invention.

The steps involved in fabricating such a device are illustrated in FIG. 2. First, in step 22 a semi-insulating GaAs substrate, or other suitable material, is implanted using a focused beam of Si$^{++}$ ions of about 140 keV energy. Conventional focused ion beam equipment is used for this process. The doping is graded between the contacts 12 and 14. The grading may be uniform and linear, as in the example of FIG. 1B, or it may be non-uniform or nonlinear. Of course, the doping profile will affect the characteristics of the device. Next, the implant is annealed at about 850° C. for about 20 minutes, in step 24. The annealing step may use a cap consisting of about 700 Angstroms of Si$_3$N$_4$ and 3,000 angstroms of S$_i$O$_2$. Then ohmic contacts of, for example, nickel/germanium/gold, may be defined using optical lithography and lift-off technigues and alloyed for about 30 seconds at about 450° C.

Figure 3:
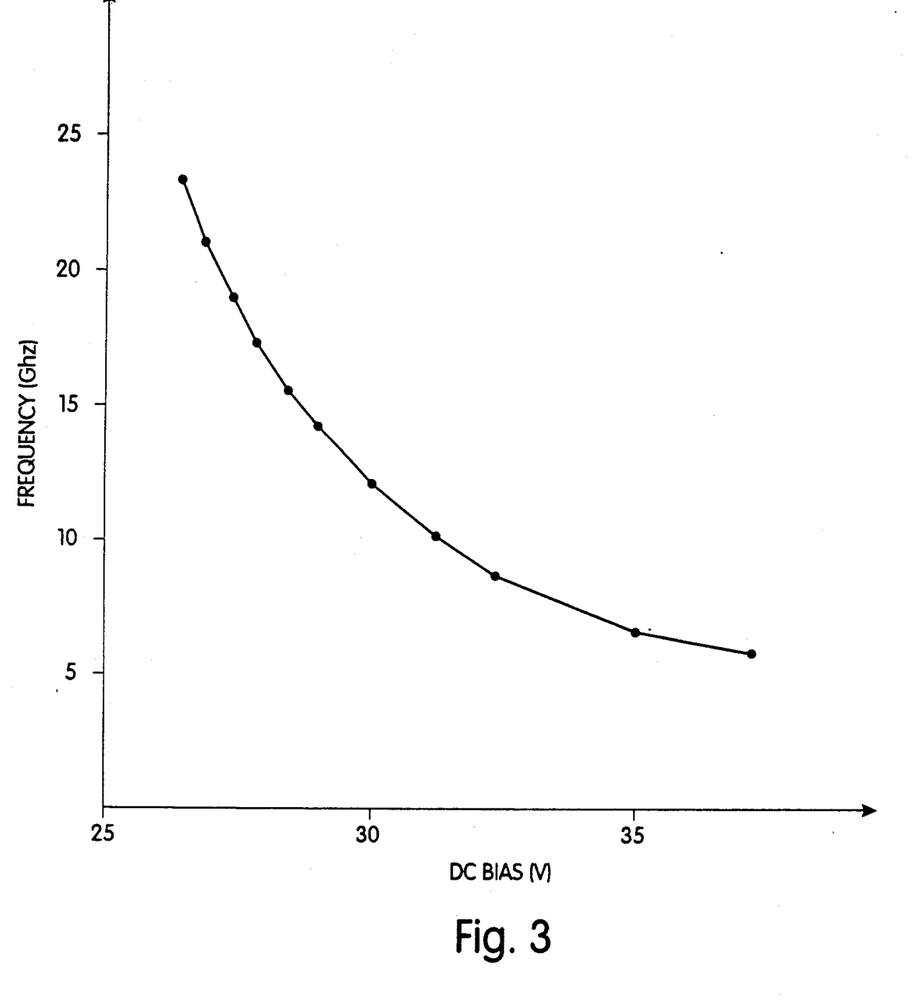
FIG. 3 is an exemplary graph of the frequency dependence of transit-time mode oscillations in Gunn diodes fabricated in accordance with the teachings herein, as a function of applied voltage.

Focused ion implantation equipment and techniques are well-known and commercially available, though not previously used to make such devices. Accordingly, the reader may refer to any convenient text or source on the subject for any necessary details not covered herein Experimentally, it has been found that a voltage on the order of 20-25 V is typically reguired to induce transit time mode Gunn oscillations in such devices of an 80 μm length. At lower applied voltages, the peak electric field in the device is everywhere below the threshold for domain nucleation, and oscillations do not occur. When the device has a uniform active region length of 80 μm (and a carrier concentration of about $10^{13}$/cm$^3$), it will oscillate at about 1.6 GHz at a bias of 34 V. The oscillation frequency shows a relatively weak dependence on bias, dropping to about 1.57 GHz when the bias is raised to 37 V. In contrast, a device with the lateral doping gradient of FIG. 1B has been seen to display a very strong dependence of frequency on bias. The transit time mode oscillation frequency has been observed in a prototype device to be smoothly tunable with DC bias over a 17 GHz range. This dependence is displayed in FIG. 3. As the bias across the device 10 is increased from 26 to 37 V, the frequency decreases from 23 to 6 GHz. The device does not oscillate for biases below 26 V, and the oscillation power decays rapidly to negligible levels for biases above 37 V.

Analytically, it appears that only the initial portion of the device contributes to the variable frequency effect and a shorter device could achieve the same performance with lower parasitic resistance, allowing operating bias levels four to five times lower.

Digressing briefly, a few remarks are in order regarding the fabrication of such Gunn diodes. The Gunn domains propagate in the sloped active region, nucleating at the concentration discontinuity, labelled "A" in FIG. 1B. The actual ohmic contacts (i.e., cathode and anode) are kept away from the active region so as not to interfere with domain propagation and nucleation. This is achieved by extending two uniformly doped segments 19 and 20 on either side of the active region, such that they extended under the ohmic contact pads. They are sufficiently long to allow for alignment error at the ohmic contact mask level (typically a few microns). They are doped sufficiently highly to make good ohmic contact. Thus, these two extensions free the active area from interference from the ohmic contacts Domain propagation depends only on the implanted profile (which can be accurately controlled with the focused ion beam) and not on the position of the ohmic contacts. If the cathode electrode were to extend into the active region, the exact point of domain nucleation would no longer be controlled accurately. The phenomenon of domain nucleation would also be affected by the damage directly under the contact. Also, the two extensions free the active region from doping level requirements to make good ohmic contacts.

Figure 4:
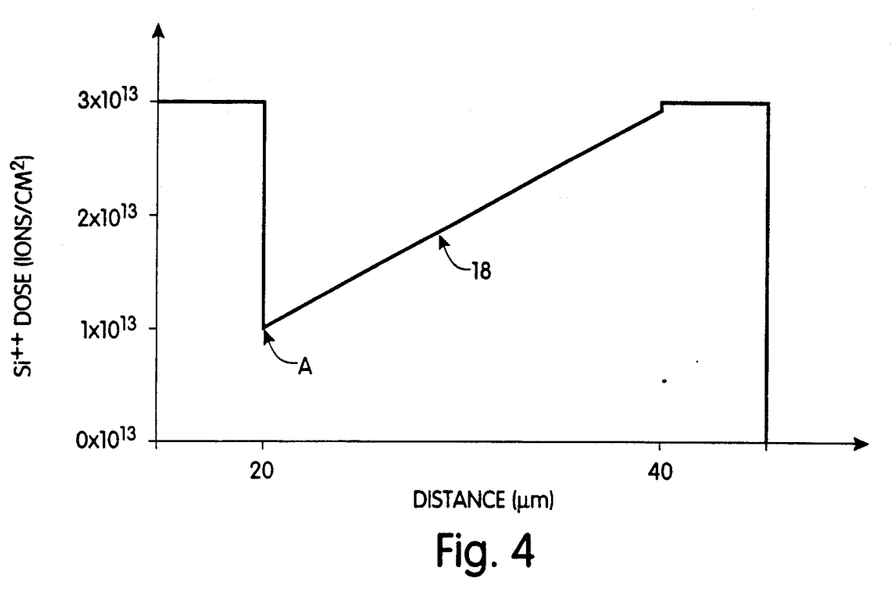
FIG. 4 is a diagram of a typical doping profile of a second embodiment of a Gunn diode according to the invention, illustrating also a shortening of the active region.

FIG. 4 shows another, more typical doping radient profile 30 for a Gunn diode embodying the present invention. Observe that the length of the active region has been shortened to 20 μm.

Figure 5A:
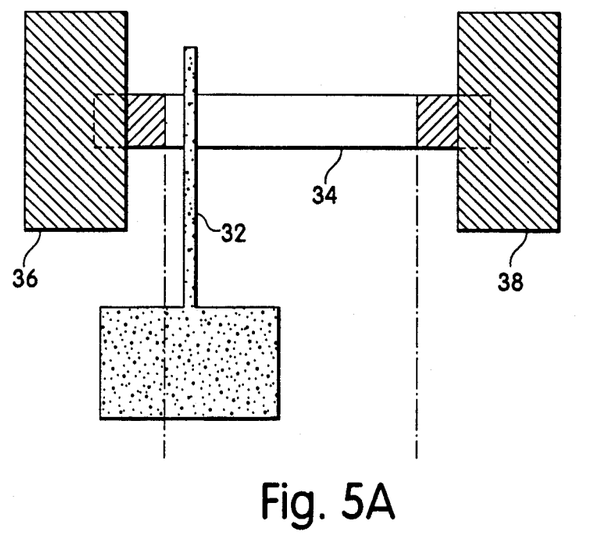
FIG. 5A is a schematic top view of a three terminal device according to the present invention, being the device of FIG. 1A to which a Schottky barrier gate has been added.
Figure 5B:
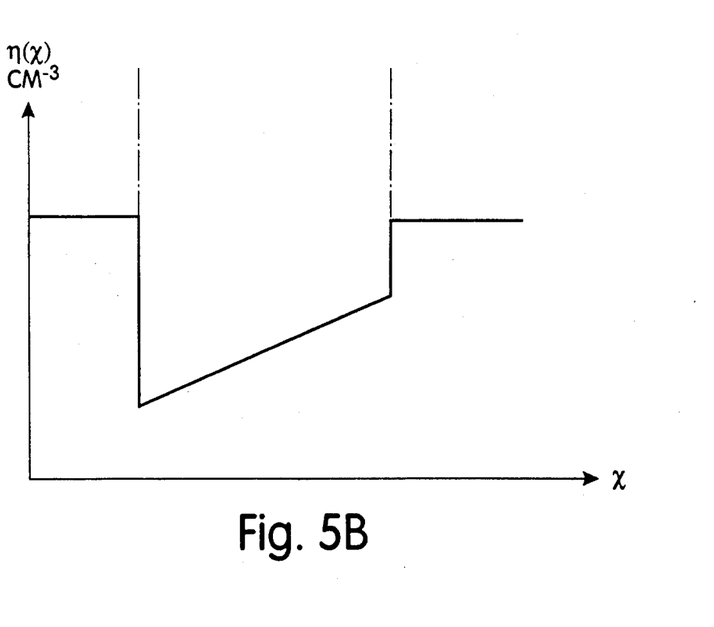
FIG. 5B is a diagram of a typical doping profile for the device of FIG. 5A.

FIG. 5A shows a three-terminal device 30, which is similar to the two-terminal device of FIG. 1A, except that a Schottky barrier gate 32 has been added. The active region 34 has the doping profile shown in FIG. 5B. As a Gunn domain travels through the Gunn diode active region from cathode 36 to anode 38, the electric field everywhere in the device rises. The current in the device is proportional to the domain sustaining electric field $E_s$ at the edges of the domain, the doping density at the domain position, and the device width at the domain position. If at some time and location the electric field reaches the threshold level $E_{th}$, at which domain nucleation occurs, a new domain will form there, and the old domain will be extinguished. In a two-terminal graded (or tapered) Gunn diode, this usually happens at or near the cathode, where the device is more resistive (in the case of a graded doping) or more narrow (in the case of a tapered cross section). By placing a Schottky barrier gate 32 across the Gunn diode near the cathode, the electric field in the device can be increased under the gate and domain nucleation can be made to occur in a controlled manner. As the gate voltage is made more negative, the depletion region depth is increased, constricting the channel height and increasing the electric field. The domain, hence, travels a shorter distance before the field under the gate reaches $E_{th}$ and a new domain nucleates, extinguishing the old one. The decreasing range of domain travel leads to a higher frequency of oscillation of the current at the ohmic device terminals. Thus, the frequency of oscillation can be controlled by varying the gate voltage.

Figure 6:
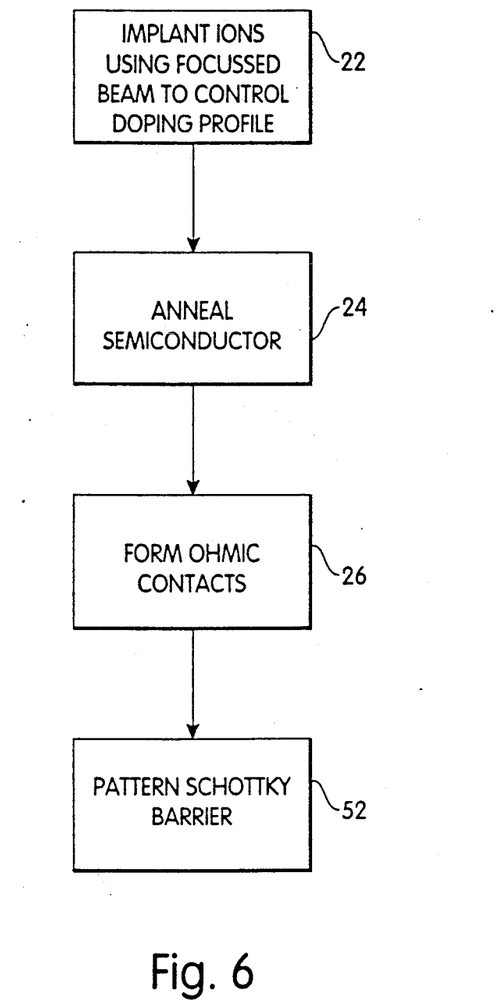
FIG. 6 is a flow chart illustrating the method of fabricating the device of FIG. 5A.

The Schottky barrier is typically a thin layer of aluminum or titanium/gold, and generally is patterned on the wafer in the last stage of fabrication. Standard photo lithographic techniques may be employed for this patterning. Typical gate width would be on the order of one half to one micron. FIG. 6 illustrates the process for making the three terminal device of FIG. 5A. It is identical to FIG. 2 except that a step 52 has been added, to take into account the patterning of the Schottky barrier.

The use of this Schottky barrier gate has several advantages. First, the frequency can be controlled with very low power applied to the gate. Secondly, the gate is electrically isolated from the cathode and anode of the diode. Third, a very small voltage change on the gate can produce a very large change in the oscillation frequency of the diode. Simulations and analyses indicate that a 10 millivolt variation in gate voltage can produce about a 10 GHz change in oscillation frequency. Simulations further show that such diodes may be fabricated with tunability ranges of 30-80 GHz. The Schottky barrier can be used to like effect in Gunn diodes having uniformly doped, active regions of tapered cross section.

The idea of having a single gate to control the extent to which the domain can travel along the graded channel can be obviously extended to more than one gate. The advantage of such an arrangement is that each gate can control the oscillation frequency in a certain band (determined by the location of the gate with respect to the graded doping profile). Having more than one gate can thus extend the tunability range of the oscillation frequency dramatically. A range of 500 MHz up to 100 GHz is then possible.

Having thus described the invention and multiple embodiments thereof, those skilled in the art will readily see various alterations, modifications and improvements to the disclosed embodiments which are not expressly stated herein. Such alterations, improvements and modifications are intended to be suggested, even if not expressly set forth, as they are within the spirit and scope of the invention. Accordingly, the invention is limited only by the appended claims and equivalents thereto, the disclosed embodiments being presented by way of example only.

What is claimed is:

1. A method of making a planar Gunn diode capable of frequency-tunable and continuous-wave oscillations in the transit-time mode of operation, such method comprising the steps of:
   a. providing a semiconductor substrate terminate at a first location by a cathode electrode and terminated at a second location by an anode electrode;
   b. selecting, for the semiconductor substrate, a doping profile having a cross-sectional area which varies as a function of the distance from the first location;
   c. implanting in the semiconductor substrate ions of an impurity by using a focused ion beam, such that the cross-sectional area of the implantation varies along a path between the first location and the second location according to the selected doping profile;
   d. annealing the semiconductor for a suitable time and at a suitable temperature whereby at least some of the implanted ions are activated to become the charge carriers of the device.

2. The method of claim 1 wherein the semiconductor is GaAs.

3. A method of making a planar Gunn diode capable of continuous wave oscillations in the transit-time mode of operation, such method comprising steps of:
   a. providing a semiconductor substrate terminated at a first location by a cathode electrode and terminated at a second location by an anode electrode;
   b. implanting in the semiconductor substrate ions of an impurity using an ion beam; and
   c. annealing the semiconductor for a suitable time and at a suitable temperature whereby at least some of the implanted ions are activated to form charge carriers in the device.

4. The method of claim 3, further comprising the steps of:
   d. selecting for the semiconductor substrate a doping profile having a cross sectional area which varies as a function of the distance from the first location; and
   wherein the cross sectional area of the implantation varies along a path between the first location and the second location according to the selected doping profile.

5. The method of claim 4, further comprising the step of forming on the surface of the semiconductor intermediate the first and second locations at least one Schottky barrier gate.

6. The method of claim 5 wherein the step of forming at least one Schottky barrier gate includes the step of forming a plurality of Schottky barrier gates spaced apart from one another.

7. The method of claim 3, wherein the step of implanting consists of implanting, using a single implantation energy, in the semiconductor substrate, ions of an impurity, and wherein during the step of annealing substantially no diffusion of said ions occurs in the semiconductor substrate.

8. A method of making a planar Gunn diode capable of continuous wave oscillations in the transit-time mode of operation, such method comprising steps of:
   a. providing a semiconductor substrate terminated at a first location by a cathode electrode and terminated at a second location by an anode electrode;
   b. implanting, using focused ion beam and a single implantation energy, ions of an impurity which ions have a low diffusion coefficient in the semiconductor substrate in the semiconductor substrate;
   c. annealing the semiconductor for a suitable time and at a suitable temperature whereby at least some of the implanted ions are activated to form charge carriers in the device;
   d. selecting for the semiconductor substrate, a doping profile having a doping concentration which varies as a function of the distance from the first location; and
   wherein the concentration of the implanted ions varies along a path between the first location and the second location according to the selecting doping profile.

9. The method of claim 8, further comprising the step of forming on the surface of the semiconductor intermediate the first and second locations at least one Schottky barrier gate.

10. The method of claim 9 wherein the step of forming at least one Schottky barrier gate includes the step of forming a plurality of Schottky barrier gates spaced apart from one another.

11. The method of claim 7, further comprising the steps of:
   selecting for the semiconductor substrate a doping profile having a cross sectional area which varies as a function of the distance from the first location; and
   wherein the cross sectional area of the implantation varies along a path between the first location and the second location according to the selected doping profile.

12. The method of claim 11, further comprising the step of forming on the surface of the semiconductor, intermediate the first and second locations, at least on Schottky barrier gate.

13. The method of claim 12 wherein the step of forming at least one Schottky barrier gate includes the step of forming a plurality of Schottky barrier gates spaced apart from one another.

14. A method of making a planar Gunn diode capable of continuous wave oscillations in the transit-time mode of operation, such method comprising the steps of:
   providing a semiconductor substrate terminated at a first location by a cathode electrode, terminated at a second location by an anode electrode and having a surface extending from the cathode to the anode;

implanting in the semiconductor substrate ions of an impurity using an ion beam;

annealing the semiconductor substrate for a suitable time and at a suitable temperature whereby at least some of the implanted ions are activated to form charge carriers in the device, wherein the charge carriers have a concentration which increases form the surface of the semiconductor material to a peak depth and which decreases from the peak depth.

15. The method of claim 14, wherein the concentration varies approximately according to a Gaussian function with the depth of the semiconductor material.

16. The method of claim 14, wherein the carriers have a mobility which decreases from the surface to a peak depth and increases from the peak depth.

17. A method of making a planar Gunn diode capable of continuous wave oscillations in the transit-time mode of operation, such method comprising steps of:
   a. providing a semiconductor substrate terminated at a first location by a cathode electrode and terminated at a second location by an anode electrode;
   b. implanting, using a focused ion beam and a single implantation energy, in the semiconductor substrate ions of an impurity which ions have a low diffusion coefficient in the semiconductor substrate; and
   c. annealing the semiconductor for a suitable time and at a suitable temperature whereby at least some of the implanted ions are activated to form charge carriers in the device.

18. The method of claim 17, wherein the semiconductor substrate is GaAs and the impurity is Si.

19. The method of claim 7, wherein the semiconductor substrate is GaAs and the impurity is Si.

20. A method of making a planar Gunn diode capable of continuous wave oscillations in the transit-time mode of operation, such method comprising the steps of:

providing a semiconductor substrate terminated at a first location by a cathode electrode, terminated at a second location by an anode electrode and having a surface extending from the cathode to the anode;

implanting in the semiconductor substrate ions of an impurity using a focused ion beam;

annealing the semiconductor substrate for a suitable time and at a suitable temperature whereby at least some of the implanted ions are activated to form charge carriers in the device, wherein the charge carriers have a concentration which increases from the surface of the semiconductor material to a peak depth and which decreases from the peak depth;

selecting for the semiconductor substrate, a doping profile having a doping concentration which varies as a function of the distance from the first location; and wherein the concentration of the implanted ions varies along a path between the first location and the second location according to the selecting doping profile.

21. The method of claim 20, further comprising the step of forming on the surface of the semiconductor intermediate the first and second locations at least one Schottky barrier gate.

22. The method of claim 21 wherein the step of forming at least one Schottky barrier gate includes the step of forming a plurality of Schottky barrier gates spaced apart from one another.

23. The method of claim 14, further comprising the steps of:

selecting for the semiconductor substrate a doping profile having a cross sectional area which varies as a function of the distance from the first location; and wherein the cross sectional area of the implantation varies along a path between the first location and the second location according to the selected doping profile.

24. The method of claim 23, further comprising the step of forming on the surface of the semiconductor intermediate the first and second locations at least one Schottky barrier gate.

25. The method of claim 24 wherein the step of forming at least one Schottky barrier gate includes the step of forming a plurality of Schottky barrier gates spaced apart form one another.

26. A method of making a planar Gunn diode capable of frequency-tunable and continuous-wave oscillations in the transit-time mode of operation, such method comprising the steps of:
   a. providing a semiconductor substrate terminated at a first location by a cathode electrode and terminated at a second location by an anode electrode;
   b. selecting, for the semiconductor substrate, a doping profile having a doping concentration which varies as a function of the distance from the first location;
   c. implanting in the semiconductor substrate ions of an impurity by using a focused ion beam, such that the concentration of the implanted ions varies along a path between the first location and the second location according to the selected doping profile; and
   d. annealing the semiconductor for a suitable time and at a suitable temperature whereby at least some of the implanted ions are activated to form the charge carriers of the device.

27. The method of claim 26 wherein the semiconductor is GaAs.

28. A method of making a planar Gunn diode capable of frequency-tunable and continuous-wave oscillations in the transit-time mode of operation, such method comprising the steps of:
   a. providing a semiconductor substrate terminated at a first location by a cathode electrode and terminated at a second location by an anode electrode;
   b. selecting, for the semiconductor substrate, a doping profile having a doping concentration which varies as a function of the distance from the first location;
   c. implanting in the semiconductor substrate ions of an impurity by using a focused ion beam, such that the concentration of the implanted ions varies along a path between the first location and the second location according to the selected doping profile;
   d. annealing the semiconductor for a suitable time and at a suitable temperature whereby at least some of the implanted ions are activated to form the charge carriers of the device; and
   e. patterning on the surface of the semiconductor intermediate the first and second locations at least one Schottky barrier gate.

29. The method of claim 28 wherein the step of patterning at least one Schottky barrier gate includes the step of patterning a plurality of Schottky barrier gates spaced apart from one another.

30. The method of claim 28 or claim 29 wherein the semiconductor is GaAs.

31. A method of making a planar Gunn diode capable of frequency-tunable and continuous-wave oscillations in the transit-time mode of operation, such method comprising the steps of:
   a. providing a semiconductor substrate terminated at a first location by a cathode electrode and terminated at a second location by an anode electrode;
   b. selecting, for the semiconductor substrate, a doping profile having a cross-sectional area which varies as a function of the distance from the first location;
   c. implanting in the semiconductor substrate ions of an impurity by using a focused ion beam, such that the cross-sectional area of the implantation varies along a path between the first location and the second location according to the selected doping profile;
   d. annealing the semiconductor for a suitable time and at a suitable temperature whereby at least some of the implanted ions are activated to become the charge carriers of the device; and
   e. patterning on the surface of the semiconductor intermediate the first and second locations at least one Schottky barrier gate.

32. The method of claim 31 wherein the step of patterning at least one Schottky barrier gate includes the step of patterning a plurality of Schottky barrier gates spaced apart from one another.

33. The method of claim 31 or claim 32 wherein the semiconductor is GaAs.

34. The method of claim 26 wherein the function describing the doping concentration is uniform and linear.

35. The method of claim 26 wherein the function describing the doping concentration is non-uniform.

36. The method of claim 26 wherein the function describing the doping concentration is non-linear.

37. The method of claim 1 wherein the function describing the doping concentration is uniform and linear.

38. The method of claim 1 wherein the function describing the doping concentration is non-uniform.

39. The method of claim 1 wherein the function describing the doping concentration is non-linear.

* * * * *